(12) United States Patent
Brady et al.

(10) Patent No.: US 9,923,508 B2
(45) Date of Patent: Mar. 20, 2018

(54) MOUNTING UNIT FOR SOLAR ELECTRICITY GENERATION SYSTEMS AND IMPROVED INSTALLATION METHOD

(71) Applicant: CoWatt Energy, LLC, San Antonio, TX (US)

(72) Inventors: Cole Brady, Inez, TX (US); William Tolhurst, San Antonio, TX (US)

(73) Assignee: Cowatt Energy, LLC., Austin, TX (US)

( * ) Notice: Subject to any disclaimer, the term of this patent is extended or adjusted under 35 U.S.C. 154(b) by 313 days.

(21) Appl. No.: 14/632,066

(22) Filed: Feb. 26, 2015

(65) Prior Publication Data

US 2016/0254774 A1 Sep. 1, 2016

(51) Int. Cl.
| | |
|---|---|
| *E04D 13/18* | (2014.01) |
| *H02S 20/00* | (2014.01) |
| *H02S 20/10* | (2014.01) |
| *H02S 20/23* | (2014.01) |
| *F16M 11/04* | (2006.01) |
| *F24J 2/52* | (2006.01) |
| *H01L 31/02* | (2006.01) |
| *H02S 20/30* | (2014.01) |

(Continued)

(52) U.S. Cl.
CPC ............. *H02S 20/00* (2013.01); *F16M 11/04* (2013.01); *F24J 2/4643* (2013.01); *F24J 2/52* (2013.01); *F24J 2/526* (2013.01); *F24J 2/5235* (2013.01); *F24J 2/5237* (2013.01); *H01L 31/02* (2013.01); *H02S 20/10* (2014.12); *H02S 20/23* (2014.12); *H02S 20/24* (2014.12); *H02S 20/30* (2014.12); *H02S 40/42* (2014.12); *F24J 2002/467* (2013.01); *F24J 2002/5292* (2013.01); *Y02B 10/12* (2013.01); *Y02E 10/47* (2013.01)

(58) Field of Classification Search
CPC .......... H02S 20/00; H02S 20/10; H02S 20/23; H02S 20/24; H02S 20/30; H02S 40/42; H01L 31/02; F16M 11/04; F24J 2/52; Y02B 10/12
USPC ........................................................ 52/173.3
See application file for complete search history.

(56) References Cited

U.S. PATENT DOCUMENTS

| | | | |
|---|---|---|---|
| 4,058,111 A * | 11/1977 | Wendel | F24J 2/268 126/570 |
| 6,105,316 A | 8/2000 | Bottger et al. | |

(Continued)

*Primary Examiner* — Charles A Fox
*Assistant Examiner* — James Buckle, Jr.
(74) *Attorney, Agent, or Firm* — Egan Peterman Enders Huston

(57) ABSTRACT

The present invention provides a mounting unit for solar panels that simplifies the complexity of storage, transit and in-field installation of solar electric generation systems. According to one embodiment, the mounting unit comprises a top panel, a bottom panel and a pair of panel guides, each formed integral with and adjacent to an opposing side of the top panel. Each panel guide includes a horizontal portion for supporting a solar panel and a vertical portion for providing an air channel between a bottom surface of the solar panel and an upper surface of the top panel. The air channel enables natural convection to cool the solar panel and optionally a power conversion device used within the system, thereby improving the solar conversion efficiency of the system. An improved method for installing a solar electric generation system is also provided herein.

28 Claims, 6 Drawing Sheets

(51) Int. Cl.
   *H02S 20/24*   (2014.01)
   *H02S 40/42*   (2014.01)
   *F24J 2/46*    (2006.01)

(56) References Cited

U.S. PATENT DOCUMENTS

| | | |
|---|---|---|
| 6,968,654 B2 | 11/2005 | Moulder et al. |
| 7,481,211 B2 | 1/2009 | Klein |
| 7,832,157 B2 | 11/2010 | Cinnamon |
| 8,371,076 B2 * | 2/2013 | Jones ............... F24J 2/5237 126/704 |
| 8,485,483 B2 * | 7/2013 | Rees ............... F24J 2/5237 248/237 |
| 8,505,248 B1 | 8/2013 | Leong et al. |
| 8,661,748 B2 | 3/2014 | Lewenz et al. |
| 8,739,478 B1 | 6/2014 | Burtt et al. |
| 8,850,754 B2 | 10/2014 | Rizzo |
| 9,494,342 B2 * | 11/2016 | Babineau, Jr. .......... H02S 20/23 |
| 2005/0217716 A1 * | 10/2005 | Masuda ............... F24J 2/5235 136/244 |
| 2009/0205703 A1 | 8/2009 | Umotoy et al. |
| 2011/0263067 A1 * | 10/2011 | Vaid ............... H01L 31/052 438/65 |
| 2011/0277400 A1 * | 11/2011 | Kosslinger ............ F24J 2/5235 52/173.1 |
| 2012/0091297 A1 * | 4/2012 | Rees ............... F24J 2/5237 248/126 |
| 2012/0110931 A1 * | 5/2012 | Eiffert ............... F24J 2/5237 52/173.3 |
| 2014/0318605 A1 | 10/2014 | Huzyak et al. |

* cited by examiner

MOUNTING UNIT FOR SOLAR ELECTRICITY GENERATION SYSTEMS AND IMPROVED INSTALLATION METHOD

BACKGROUND OF THE INVENTION

1. Field of the Invention

The present invention is in the technical field of solar electricity generation systems. More particularly, the present invention is in the technical field of solar panel mounting and installation assemblies within solar electric generation systems.

2. Description of the Relevant Art

The following descriptions and examples are provided as background only and are intended to reveal information that is believed to be of possible relevance to the present invention. No admission is necessarily intended, or should be construed, that any of the following information constitutes prior art impacting the patentable character of the subject matter claimed herein.

Within a solar electric generation system that utilizes solar panels, conventional systems for mounting and installing the solar panels rely on the delivery and in-field assembly of a large number of individual metal components at the site of the generation system to create a mounting assembly. The design of the mounting assembly may vary depending on whether the solar electric generation system is ground mounted, or mounted onto a roof, over-hang or other building structure.

In most cases, the mounting assembly usually comprises a number of metal components (such as rails, frames, clamps and vertical supports), which must be assembled on-site by an experienced field technician to form an open frame or rack structure for supporting a plurality of solar panels. The solar panels do not come preassembled onto the mounting assembly and must be installed (typically using a plurality of mechanical fasteners, such as clamps and screws) on-site. Once the solar panels are in place, the electrical components of the system must be properly wired in order to produce electricity that can be utilized by entities such as homes, businesses, utilities, and electric equipment.

These conventional systems require substantial site preparation activities and in-field labor by skilled technicians that are expensive and provide limited opportunity to control or inspect the work product during construction. In addition, the implementation resulting from this conventional approach can vary greatly from site to site. Thus, the conventional approach significantly hampers the ability for solar panel mounting and installation to become more standardized, and hence more cost effective. Further, conventional systems do not seek to optimize natural convection forces for purposes of cooling the solar panel and associated power conversion devices, and thus, fail to optimize the solar conversion efficiency of the system electric generation system.

SUMMARY OF THE INVENTION

The following description of various embodiments of solar electric generation system and methods for efficiently storing, transporting and installing a solar electric generation system is not to be construed in any way as limiting the subject matter of the appended claims.

According to one embodiment, a solar electric generating system is provided herein comprising a mounting unit generally including a bottom panel having a substantially planar rectangular shape, and a top panel having a substantially planar rectangular shape, wherein the top panel is oriented at an angle with respect to the bottom panel. The mounting unit also generally comprises a pair of panel guides, each formed integral with and adjacent to an opposing side of the top panel. Each panel guide generally comprises a horizontal portion configured for supporting one or more solar panels, and a vertical portion configured for providing a gap between a bottom surface of the solar panel(s) and an upper surface of the top panel.

In one embodiment, a width of the horizontal portion of the panel guides may range between about ¼ inch and about 4 inches. In one embodiment, a height of the vertical portion of the panel guides may range between about 1 inch and about 12 inches. In one embodiment, a length of the panel guides may be approximately equal to a length of a solar panel, or possibly two solar panels arranged end-to-end.

The gap between the bottom surface of the solar panel(s) and the upper surface of the top panel advantageously provides an air channel through which convective forces may cool the bottom surface of the solar panel(s), thereby increasing the solar conversion efficiency. In some embodiments, an upper surface of the top panel may be covered or coated with a reflective material to further increase efficiency by reflecting light that passes through the solar panel(s) back up into the solar panel(s) to be recaptured and converted into energy.

In one embodiment, the solar panel(s) may be affixed to the horizontal portions of the panel guides, preferably with an adhesive, although other means of attachment may be used (such as a plurality of clips or a plurality of clamps). In some embodiments, each panel guide may comprise one or more solar panel risers configured to provide clearance between the horizontal portion of the panel guide and a bottom surface of the solar panel, so that a desired thickness of adhesive can be used to affix the solar panel to the horizontal portion of panel guide. In addition, each panel guide may comprise one or more solar panel spacers configured to retain the solar panel in position during assembly, and to protect the solar panel from contact when multiple mounting units are stacked.

In one embodiment, one or more power conversion devices may be electrically coupled to the solar panel and configured to convert a DC signal output from the solar panel into an AC signal. In one embodiment, a power conversion device (such as a micro-inverter) may be mechanically coupled to the mounting unit, e.g., by mounting the power conversion device within a notch formed within the top panel, or elsewhere within the mounting unit. If mounted within the notch, the convective air flow through the air channel may further function to cool the power conversion device. In alternative embodiments, a string inverter or a central inverter may be coupled to a plurality of solar panels for converting the DC signal output from the solar panels, in lieu of a micro-inverter coupled within the mounting unit.

In one embodiment, the mounting unit may further comprise a pair of sidewalls extending substantially vertically from opposing edges of the bottom panel to abut opposing edges of the top panel. In this embodiment, the bottom panel, the top panel and the sidewalls of the mounting unit may be formed integrally as one piece. In some embodiments, a front panel may also be formed integral with the bottom panel, the top panel and the sidewalls. A pair of hinges, each located on one of the sidewalls near a rear of the mounting unit, may be configured for connecting adjacent mounting units together.

In another embodiment, the mounting unit may further comprise a plurality of support legs, which are configured for connecting the top panel to the bottom panel and for orienting the top panel at the angle relative to the bottom panel. In one embodiment, at least a subset of the support legs may comprise adjustment means for changing the angle with which the top panel is oriented relative to the bottom panel.

The mounting unit described herein is preferably formed entirely or almost completely from electrically inert materials. In one embodiment, the mounting unit may be formed via an injection molded process using a thermoplastic material, such as a medium or high density polyethylene. In other embodiments, substantially different processes (e.g., a roto-molding process, a 3D printing process or vacuum forming) and/or substantially different materials (e.g., fiberglass, a plastic material impregnated with a fiber material, or a metal material over-molded with a plastic layer) may be used to form the mounting unit. Forming the mounting unit entirely or almost completely from electrically inert materials (such as those described herein) avoids the need to electrically ground the mounting unit.

According to another embodiment, a method for installing a plurality of solar electric generating systems is provided herein. In addition to one or more of the features described above, each solar electric generating system may generally comprise a mounting unit having a pair of hinges located on sidewalls of the mounting unit near a rear of the mounting unit for connecting adjacent mounting units together.

In one embodiment, the installation method may include arranging a first solar electric generating system onto a substantially horizontal surface, arranging a second solar electric generating system onto the substantially horizontal surface adjacent to the first solar electric generating system, so that adjacent hinges are aligned, and inserting a hinge pin through hinge pin holes of the aligned hinges to connect adjacent mounting units of the first and second solar electric generating systems together.

In some embodiments, each system may comprise at least one solar panel preassembled onto the mounting unit. In other embodiments, the installation method may include affixing one or more solar panels onto the mounting units of the first and second solar generating systems before or after the first and second solar generating systems are arranged onto the substantially horizontal surface.

In some embodiments, each system may comprise a power conversion device preassembled onto the mounting unit. In other embodiments, the installation method may include electrically and/or mechanically coupling one or more power conversion devices to the first and second solar electric generating systems before or after the first and second solar generating systems are arranged onto the substantially horizontal surface. In some embodiments, the installation method may include repeating the steps of arranging, inserting and coupling until a desired number of solar electric generating systems are mechanically and electrically coupled together.

Sometime after each solar electric generating system is arranged, the installation method may further comprise securing a bottom of the solar electric generating system to the substantially horizontal surface. In some embodiments, the securing step may comprise at least partially filling an interior cavity of each mounting unit with a ballast material. When the substantially horizontal surface is a ground surface, the securing step may additionally or alternatively comprise driving a hinge pin into the ground surface through a slot formed on a bottom panel of each mounting unit. When the substantially horizontal surface is a rooftop or other substantially horizontal building structure, the securing step may additionally or alternatively comprise inserting a mechanical fastener through a slot formed on a bottom panel of each mounting unit.

The solar electric generation system described herein provides many advantages over conventional systems. First, the mounting unit of the solar electric generation system integrates all of the key features required to mount a solar panel and power conversion device. According to one embodiment, the mounting unit may be implemented as a single plastic molded unit. The use of a plastic material for the mounting unit (or other electrically inert material) eliminates the need for the mounting unit to be electrically grounded. Unlike conventional systems, the solar panel and/or power conversion device may be preassembled onto the mounting unit prior to shipment of the unit to the solar generation site, in some embodiments. This significantly reduces installation time and cost over conventional assembly methods, which assemble the solar panels onto a racking assembly on-site. The presently disclosed mounting units, which may come preassembled with solar panels and/or power conversion devices, may also be stacked in a manner that enables efficient storage and shipment of multiple units to the solar generation site without damaging the solar panels. Each mounting unit is also advantageously designed with an air channel that optimizes convection cooling of the solar panel and optionally the power conversion device, and may include a reflective surface that further increases efficiency.

BRIEF DESCRIPTION OF THE DRAWINGS

Other objects and advantages of the invention will become apparent upon reading the following detailed description and upon reference to the accompanying drawings.

Figure 1:
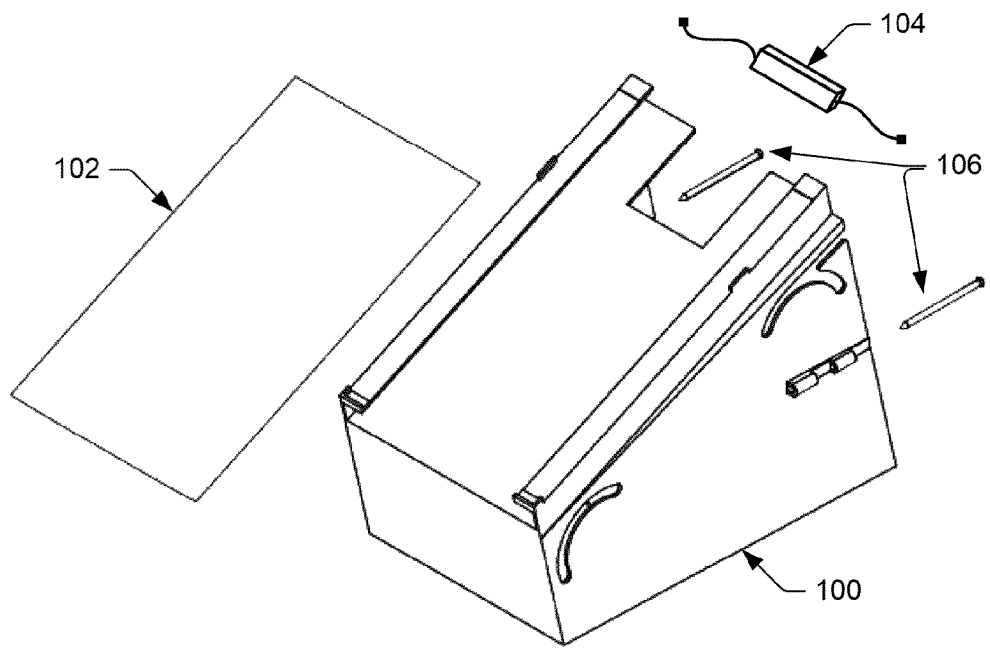
FIG. 1 is an oblique front view illustrating one embodiment of a solar generation system including a mounting unit configured for supporting one or more solar panels and optionally a power conversion device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to the invention in more detail, FIG. 1 shows one embodiment of a solar electricity generation system comprising a mounting unit 100, a solar panel 102 that converts light into electricity, a power conversion device 104 that converts the DC output of solar panel 102 into the proper AC current and voltage types and levels to match the requirements for its connection to a load or electric distribution system, and two hinge pin-stakes 106. Together these components constitute one preferred embodiment of a solar electricity generation system. Additional features of the solar electricity generation system are illustrated in FIGS. 2-11 and discussed in more detail below. While the solar electricity generation system described herein is generally designed for a ground mounted installation, one skilled in the art would readily understand how it may be alternatively installed on any substantially horizontal surface, such as a building rooftop, scaffolding, frame, trailer bed, road, or a cement or concrete pad.

Figure 2:
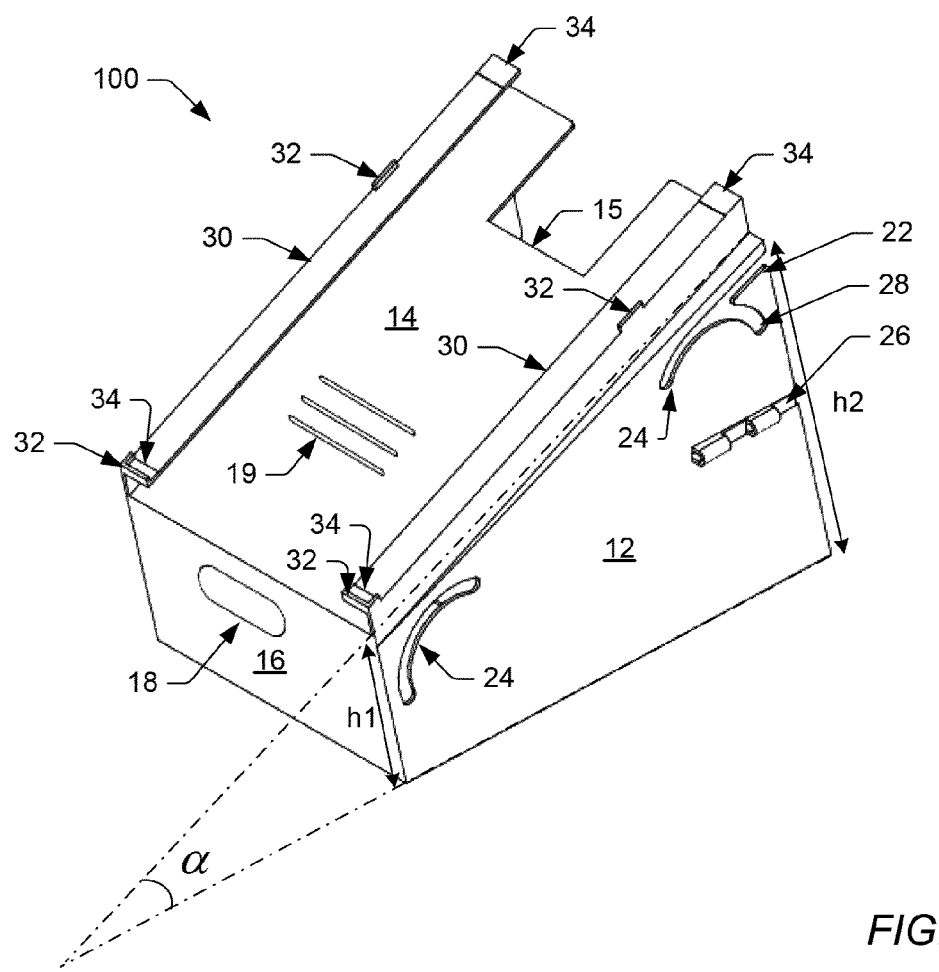
FIG. 2 identifies certain features of the mounting unit of FIG. 1 visible from an oblique front view.
Figure 3:
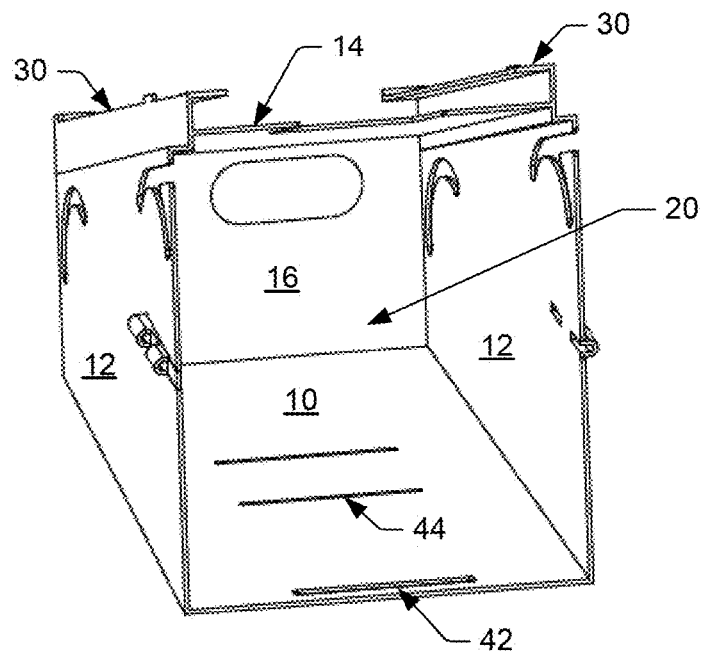
FIG. 3 identifies additional features of the mounting unit of FIG. 1 visible from a back view.

FIGS. 2-3 illustrate several features of the mounting unit 100 shown in FIG. 1, which provide distinct advantages over conventional mounting assemblies. In the particular embodiment shown in FIGS. 2-3, mounting unit 100 is illustrated as a single plastic molded unit, which integrates all features required to mount a solar panel and a power conversion device within the unit. This one-piece design facilitates a fast and easy solar installation, significantly decreasing installation cost and time. With some preparatory site planning, an array of mounting units 100 can easily be installed by an unskilled person or persons with the aid of a qualified electrician. Exemplary methods for installing an array of such mounting units will be discussed below with respect to FIGS. 8-10.

According to one embodiment, mounting unit 100 may generally comprise an open-ended box-type structure having at least a planar bottom panel 10, two sidewalls 12 extending substantially vertically from opposing edges of the bottom panel 10, and a planar top panel 14 formed integral with upper surfaces of the sidewalls. As described in more detail below, the planar top panel 14 may be oriented at some angle (a) with respect to the substantially horizontally oriented planar bottom panel 10, so as to orient a solar panel in an optimum position for receiving solar radiation.

According to one embodiment, the planar top panel 14 and the planar bottom panel 10 may be rectangular in shape, as show in FIGS. 1-3. However, it should be understood that the planar top panel 14 and the planar bottom panel 10 are not limited to strictly rectangular shapes. In one embodiment, the long sides of these rectangular shapes may converge slightly towards a front end of the mounting unit to facilitate nesting or stacking of the mounting units. As used herein, a panel having a "substantially rectangular" shape is considered to encompass both scenarios. The top and bottom panels are also not limited to planar or "substantially rectangular" shapes, and may comprise substantially different shapes and/or contours in other embodiments. For example, the top and bottom panels may be formed integral with one another and with a curved contour configured for producing an airfoil or venturi shape.

In some embodiments (not shown), front and back ends of the mounting unit 100 may be left open, allowing airflow through the mounting unit 100. In other embodiments (shown in FIGS. 2-3), rigidity of the mounting unit 100 may be improved by including a front panel 16, which is formed integral with bottom panel 10, sidewalls 12 and top panel 14. The front panel 16 may be a substantially planar rectangular shape, some other planar shape, or may have a curved contour. Regardless of the particular shape, inclusion of front panel 16 generally results in a cavity 20 formed within the interior of the mounting unit 100.

In one embodiment, one or more air vent holes 18 may be formed within the front panel 16 in order to minimize the effect of high winds blowing into the cavity 20 from the rear of the mounting unit 100 and attempting to dislocate, stress or deform the mounting unit 100. In addition or alternatively, one or more slots, perforations, or louvers 19 may be formed in the top panel 14 of the mounting unit 100. Similar to air vent holes 18, slots, perforations, or louvers 19 may function to minimize the effect of high winds blowing in from the rear of the mounting unit 100 and attempting to dislocate, stress or deform the mounting unit 100. In addition, slots, perforations, or louvers 19 may function to improve airflow in air channel 36 (see, FIG. 4), which is created between mounting unit 100 and solar panel 102 when the solar panel is assembled onto the mounting unit.

Additional features enable the mounting unit 100 to be easily moved into position at the generation site, and secured in place once properly positioned. In one embodiment, a pair of hand grips 22 may be formed on sidewalls 12, one on each side of the mounting unit 100 near the rear of the unit. As described in more detail below, hand grips 22 may enable the mounting unit to be pulled rearward in order to separate one mounting unit from another when the units are in nested form. In addition to hand grips 22, a pair of hand holds 24 may be included on each of the sidewalls 12, one pair on each side of the mounting unit 100, to enable the mounting unit to be moved about either manually or via machine until properly located at the generation site. In some embodiments, the air vent holes 18 may also be utilized to assist in moving the mounting unit 100 into position.

As described in more detail below, a plurality of mounting units are typically installed at a generation site by first arranging the mounting units adjacent to one another in a line. As each mounting unit is placed adjacent to a previous mounting unit, the adjacent units are coupled together both mechanically and electrically. In one embodiment, a pair of hinges 26 is located on the sidewalls 12 near the rear of the mounting unit 100 in order to accomplish a mechanical interconnection with adjacent mounting units as described in more detail below. Hinges 26 are generally preferred as they provide a simple, yet effective method of attachment, while allowing small movements between adjacent units and providing tolerances for uneven terrain. However, mounting unit 100 is not limited to the use of hinges 26, and may use additional or alternative means of mechanical attachment in other embodiments of the invention.

According to one embodiment, two cable vias 28 may be included on the sidewalls 12 of the mounting unit 100 in order to allow connecting cables from the power conversion device 104 to be routed in proper polarity and order to adjacent mounting units, as described in more below detail.

In the illustrated embodiment, cable vias 28 may also be used to provide one of the hand holds 24. In other embodiments, separate hand holds 24 and cable vias 28 may be formed on sidewalls 12.

As shown in FIG. 3, hand-stake slot 42 may be formed within the bottom panel 10 of mounting unit 100 to provide a means for lifting the rear of the mounting unit manually or by machine. Hand-stake slot 42 can also be used as a means to secure the location of the mounting unit on the ground via one or more of the hinge-stake pins 106, as described in more detail below. For other types of installation, bolts or other mechanical fasteners may be inserted through the hand-stake slot 42 to secure the mounting unit 100 to a rooftop, scaffolding, frame, trailer bed, road, or a cement or concrete pad. In one embodiment, one or more slots, perforations, or louvers 44 may also be formed within the bottom panel 10 to allow accumulated water to exit the mounting unit interior.

A variety of power conversion devices (such as inverters or thermo-electric generators) can be used within the solar electric generation system to convert the DC output provided by one or more solar panels 102 into an AC input. According to one embodiment, a power conversion device can be placed and secured within a notch 15 formed within the top panel 14 of the mounting unit 100. Exemplary means for securing a power conversion device with the notch 15 may include, but are not limited to use of a mounting plate, a strap, one or more self-tapping screws, one or more bolts, or an adhesive.

According to one embodiment, a micro-inverter, such as the MIG300 on-grid micro-inverter provided by Darfon, may be placed and secured within the notch 15. The MIG300 generally functions to convert the DC output from one or two solar panels 102 into an approximately 240V, 60 Hz, single phase AC signal. However, power conversion device 104 is not limited to the MIG300 and may comprise other micro-inverters, which may be configured for outputting different voltage types and levels. For a commercial or utility application, for example, a micro-inverter configured for generating an approximately 480V, 60 Hz, three phase AC signal may be used.

Although a micro-inverter is preferred in at least one embodiment, the solar electricity generation system described herein is not limited to the use of micro-inverters, or the placement of a power conversion device 104 within a notch 15 formed within a top panel 14 of the mounting unit 100. In one alternative embodiment, a micro-inverter may be secured elsewhere within the mounting unit (such as an inside of one of the sidewalls 12) by means of a mounting plate, a strap, one or more self-tapping screws, one or more bolts, or an adhesive. In another alternative embodiment, a string inverter coupled to a serial string of solar panels, or a central inverter coupled to an array of solar panels may be used instead of a micro-inverter.

The main function of a power conversion device, such as a micro-inverter, string inverter or central inverter, is to convert the direct current (DC) produced by one or more solar panels into alternating current (AC). However, since most solar electric generation systems are also tied into an electrical distribution system (i.e., a power grid), the power conversion device must also match the AC voltage to the grid voltage (e.g., 240 or 480 volts AC), and generally includes oscillators for synchronizing its frequency and phase with that of the grid (e.g., 60 Hz, single- or three-phase). Although slightly more expensive, micro-inverters are generally desirable over central inverters due to the fact that they harvest more electricity (e.g., about 5% to about 20% more), output AC current directly from each solar panel (and therefore do not require DC wiring), and output 240/480 volts AC as opposed to 600 volts DC (which is safer). In addition, the MIG300 micro-inverter provided by Darfon is implemented with a single input cable and a single output cable, which enables a string of micro-inverters to be quickly and easily connected via water-tight male and female connector plugs. The integrated grounding provided by the input/output cables eliminates the need for additional grounding equipment.

According to one embodiment, top panel 14 may be dimensioned and designed to support a single solar panel 102 comprising a number of solar cells (e.g., 60, 72 or 96 solar cells). As such, the width and length of the top panel 14 may be roughly the same as, or slightly larger than, that of a single solar panel. Typical solar panel dimensions may range between about 65-75 inches in length and between about 35-45 inches in width, although dimensions will vary depending on the manufacturer of the solar panel, whether the panel is framed or frameless, the number of solar cells included on the panel, and the material used to form the solar cells. In most cases, top panel 14 may be dimensioned to support a variety of standard and possibly non-standard solar panel sizes.

Alternatively, top panel 14 may be dimensioned and designed to support two or more solar panels, each comprising a number of solar cells. In one alternative embodiment, top panel 14 may be dimensioned and designed to support a pair of solar panels arranged side-by-side. In such an embodiment, the width of the top panel may be roughly equivalent to twice the width of a standard or non-standard solar panel, and thus, may range between approximately 70-90 inches. The length of the top panel may be roughly equivalent to the length of the solar panels, in this embodiment.

In another alternative embodiment, top panel 14 may be dimensioned and designed to support a pair of solar panels arranged end-to-end. In such an embodiment, the length of the top panel may be roughly equivalent to twice the length of a standard or non-standard solar panel, and thus, may range between approximately 130-150 inches. The width of the top panel may be roughly equivalent to the width of the solar panels, in this embodiment. This latter design has the advantage of effectively lengthening the air channel 36 (see, FIG. 4) created between the bottom surface of the solar panels and the upper surface of the top panel, thereby increasing the effectiveness of the air channel.

Regardless of the number of solar panels supported, the top panel 14 may also be dimensioned and designed to support the solar panel(s) at an angle (a) ranging between about 20° to about 50° with respect to the horizontal, in order to arrange the solar panel in the optimum position for receiving solar radiation. The particular angle chosen will generally be close to the angle of latitude at the site of installation.

In the illustrated embodiment, the top panel 14 (and thus the solar panel 102) is positioned at a particular angle ($\alpha$) with respect to the horizontal plane of the bottom panel 10 by configuring a height (h1) of a front end of sidewalls 12 to be substantially smaller than the height (h2) of a back end of sidewalls 12. In some embodiments, different mounting units may be designed to achieve different angles ($\alpha$), which are optimized for collecting solar radiation from different geographical regions. In other embodiments (see, e.g., FIG. 11), the mounting unit may be designed, such that the angle ($\alpha$) with which the top panel is arranged with respect to the bottom panel is adjustable throughout a given range.

According to one embodiment, solar panel 102 may be a dual-glass, frameless panel including about 60-96 monocrystalline silicon photovoltaic (PV) cells. One exemplary solar panel may be a 60 cell solar panel obtained from Trina Solar, and may be approximately 66 inches in length, approximately 39 inches in width and approximately 6 millimeters in depth. However, mounting unit 100 is not limited to the use of such a solar panel and may be alternatively configured for supporting a framed solar panel comprising any number of monocrystalline silicon PV cells, or a solar panel comprising thin film PV cells, such as those using Cadmium Telluride (CdTe) or Copper Indium Gallium diSelenide (CIGs) technology. In at least some embodiments, frameless panels may be preferred over framed panels due to the lack of electrical grounding required for frameless panels, and monocrystalline silicon cells may be preferred over thin film cells, due to the currently greater efficiency of monocrystalline silicon in converting light into electrical energy. As thin film technologies advance and become more efficient solar converters, thin film cells may be preferred over their monocrystalline counterparts, due to their substantially lower manufacturing cost.

In order to support a single solar panel 102, mounting unit 100 preferably comprises a pair of panel guides 30, which are formed integral with and adjacent to each side of the top panel 14 of the mounting unit 100. Panel guides 30 may be generally configured to support and properly orient the solar panel on the mounting unit 100. In addition, panel guides 30 may be configured to maintain a gap between a bottom surface of the solar panel 102 and the upper surface of the top panel 14, thereby creating an air channel 36 through which convective forces may cool the bottom surface of the solar panel 102 and optionally the power conversion device 104.

In some embodiments, additional support may be needed to mount additional solar panel(s) onto the mounting unit. For example, when a pair of solar panels are supported on one mounting unit, either in a side-by-side or end-to-end configuration, an additional panel guide (not shown) or alternative support member (not shown) may be formed on the top panel 14 to provide support at the junction between the two solar panels. The additional panel guide or alternative support member may be similar to the panel guides 30 shown in FIGS. 2-11 and described in more detail below, or may have substantially different features.

In one embodiment, a solar panel 102 may be assembled onto the mounting unit 100 by affixing the solar panel to an uppermost surface of the panel guides 30. Two solar panel spacers 32 are located on the outer side and the front end of each panel guide 30 to properly orient the solar panel for assembly onto the mounting unit 100 and to prevent the solar panel from sliding down or laterally from its proper position due to gravity or other forces while the assembly is taking place. In addition, panel spacers 32 also provide protection from contact or crushing forces when the mounting units are stacked, as described later in more detail.

In some embodiments, the solar panel 102 may be affixed to the panel guides 30 by using an adhesive (e.g., a silicone or polyurethane adhesive) to bond the solar panel to the panel guides. While many different types of adhesives may be used, a desirable adhesive will exhibit a high bonding strength between the glass solar panel 102 and the plastic mounting unit 100. One type of adhesive that may be used to bond the solar panel 102 to the panel guides 30 is an automotive direct glazing adhesive typically used for bonding windshields. Another type of adhesive is a structural glazing adhesive used for assembling glass panels on building exterior walls.

An adhesive is desirable, in at least one embodiment, since it provides a secure method of attachment and avoids the use of metal clamps, screws or other mechanical fasteners typically used to assemble solar panels to conventional mounting assemblies. An adhesive bond also allows for thermal expansion tolerances between the glass solar panel(s) 102 and the plastic mounting unit 100. An adhesive bond may also act as a theft deterrent, as it is significantly harder to remove an adhesively bonded solar panel without the proper tools and without damaging the solar panel. This assembly method also enables the solar panel 102 and/or the power conversion device 104 to be preassembled or mounted onto the mounting unit 100 prior to shipment to the solar generation site. This greatly reduces installation time and costs by reducing the steps needed to install the system at the generation site.

Although preassembly provides certain advantages, the use of an adhesive does not preclude the assembly of a solar panel onto the mounting unit at the generation site. In some embodiments of the installation method described herein, the solar panel(s) 102 may be affixed to the panel guides 30 on-site by way of an adhesive. While adhesive bonding is generally preferred, it is recognized that other means may be used to affix the solar panel 102 to the panel guides 30 in a permanent, semi-permanent, or non-permanent manner. As but one example, a plurality of clips or a plurality of clamps (such as the Trina clamps provided by Trina Solar) may be used to affix the solar panel 102 to the panel guides 30. Other mechanical means for affixing the solar panel to the panel guides may also be used, and such means may be used with or without the additional use of an adhesive. Such means may also be used to preassemble the solar panel onto the mounting unit prior to shipment to the solar generation site, or may be used to assemble the solar panel onto the mounting unit on-site.

In some embodiments, two solar panel risers 34 may be located at the front and back ends of each of the panel guides 30 to provide clearance between the uppermost surface of the panel guide 30 and the bottom surface of the solar panel 102, so that a proper thickness of adhesive can be used to affix the solar panel to the uppermost surface of panel guide. In addition, the uppermost surface of the panel guide 30 may be dimensioned, so as to provide sufficient area for adhering the solar panel to the uppermost surface. According to one embodiment, a width of the uppermost surface of the panel guide 30 may range between about ¼ inch and about 4 inches. Similar to the top panel 14, the length of the uppermost surface of the panel guide 30 may be substantially equal to, or slightly greater than, the length of the solar panel, and thus, may range between about 65-75 inches, in some embodiments.

As shown most clearly in FIG. 3, each of the panel guides 30 may be implemented as an inverted L-shaped structure with the bottom of the "L" forming the uppermost surface (i.e., horizontal portion) of the panel guide. The vertical portion of the "L" is generally dimensioned to provide a gap between the bottom surface of the solar panel 102 and the top panel 14 of the mounting unit 100. According to one embodiment, a height of the vertical portion of the panel guide 30 may range between about 1 inch and about 12 inches. In other embodiments, the panel guides may be shaped somewhat differently (e.g., a solid or hollow rectangular tube), as long as they provide a horizontal portion for supporting the solar panel and at least one vertical portion for providing the gap. The gap is desirable, in one respect, since it provides an air channel 36 (see, FIG. 4) through which convective forces can be used to cool the solar panel and optionally the power conversion device, thereby increasing the efficiency with which solar energy is converted into electrical energy. An air channel inlet 38 and an air channel outlet 40 are created when the solar panel 102 is assembled onto the mounting unit 100. The function of this air channel will be described in more detail with respect to FIG. 4.

The gap formed between the bottom surface of the solar panel 102 and the top panel 14 of the mounting unit 100 further provides the opportunity to include additional means for increasing the solar conversion efficiency of the system. In some embodiments, for example, the upper surface of the top panel 14 may be covered or coated with a reflective surface to bounce light that passes through the solar panel back up into the solar panel, thereby increasing the amount of light captured and converted into energy. Because the upper surface of the top panel 14 is planar and substantially parallel with the lower surface of the solar panel 102, the reflective surface applied to the top panel enables a relatively large amount of specular reflection to be recaptured by the solar panel. Conventional mounting assemblies do not provide a planar surface, which is spaced apart from yet substantially parallel with the lower surface of the solar panel, and thus, fail to provide a surface upon which a reflective material can be placed to recapture light that passes through the solar panel. The use of a reflective material on the upper surface of the top panel 14 thereby provides a significant increase in solar conversion efficiency, as compared to conventional systems.

According to one embodiment, the upper surface of the top panel 14 may be covered with a thin aluminum foil layer, such as (or similar to) those used in radiant barrier applications. According to another embodiment, the upper surface of the top panel 14 may be coated with a highly reflective paint or a high gloss polyurethane coating. In addition to increasing the reflectivity of the top panel 14 and the amount of light collected by the solar panel 102, the reflective surface applied to the top panel 14 may further protect the top panel from UV degradation.

Figure 4:
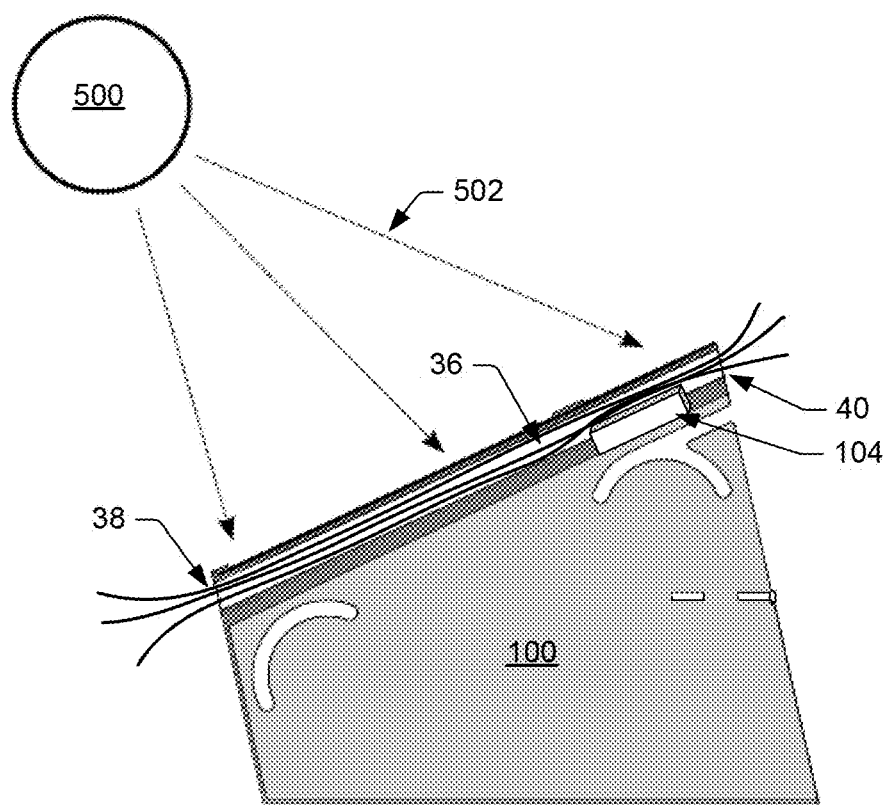
FIG. 4 illustrates convective forces created from heating of the solar panel, and the channel within which this convection occurs.

FIG. 4 is a side view illustrating solar panel 102 assembled onto mounting unit 100, and more specifically, illustrating the convection that is created from heating of the solar panel, and the air channel 36 within which this convection occurs. As a solar light source 500, such as the Sun, shines light 502 onto the solar panel 102, the solar panel 102 begins to warm up. As panel 102 heats up, its efficiency begins to drop and the air inside the air channel 36 between the bottom of the solar panel and upper surface of the top panel 14 begins to heat up as well. The heated air in channel 36 begins to move upward in channel 36 toward the air outlet 40. This air movement creates a natural convection process, drawing cooler air into the channel 36 from the air inlet 38, which cools the solar panel 102. When a power conversion device 14 is mounted within notch 15, the cooler air drawn into the channel 36 also moves over the top of the power conversion device, cooling the device. This cooling lessens the output losses of panel 102 due to heat and lessens the likelihood of interruption or failure of the power conversion device 104 due to overheating.

According to one embodiment, mounting unit 100 may be formed entirely or almost completely from an electrically inert material. In one example, mounting unit 100 may be formed via an injection molded process using a thermoplastic material, such as a medium or high density polyethylene (MDPE or HDPE), to produce a substantially rigid, open-ended structure, which is both electrically and thermally non-conductive and resistant to environmental degradation. However, the process used to form the mounting unit is not strictly limited to injection molding of a thermoplastic material. In other embodiments, substantially different processes (e.g., a rotomolding process, a 3D printing process or vacuum forming) and/or substantially different materials (e.g., fiberglass, a plastic material impregnated with a fiber material, or a metal material over-molded with a plastic layer) may be used to form the mounting unit, as long as such processes and materials can be used to achieve the desired features. The advantages of using an electrically inert material to form the mounting unit 100 are that it eliminates the need for the mounting unit to be electrically grounded, which improves safety and reduces cost and time.

Figure 5:
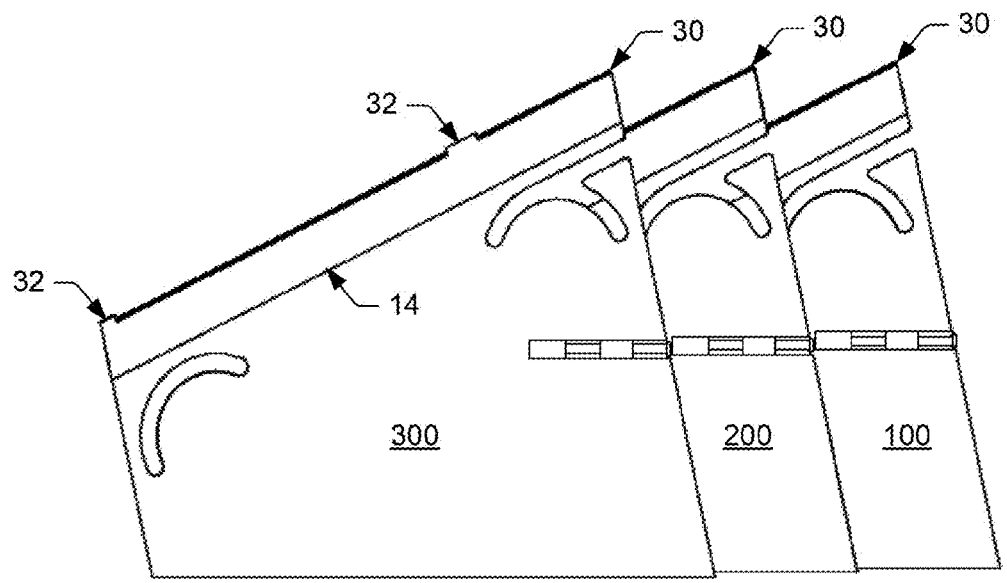
FIG. 5 shows how multiple mounting units can stack one inside the other during storage or transit.
Figure 6:
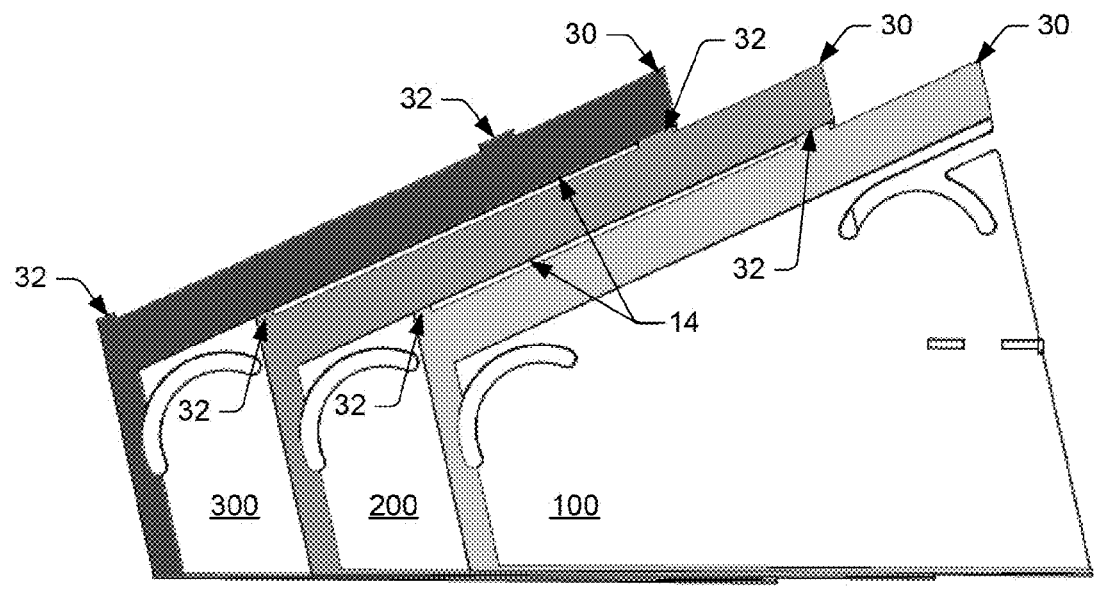
FIG. 6 provides greater detail of certain features of the stacked mounting units that provide protection for the solar panel during storage or transit.

In another embodiment of the invention, a plurality of mounting units 100 may be stacked or nested in a manner that enables efficient storage and shipment to the solar generation site. FIGS. 5-6 show, by an example using three mounting units 100, 200 and 300, how multiple mounting units may be stacked for both storage and transit. The front of mounting unit 200 slides into the rear opening of mounting unit 300, moving further into mounting unit 300 until panel guides 30 and panel spacers 32 of mounting unit 200 make contact with the underside of top panel 14 of mounting unit 300. Similarly, mounting unit 100 slides into the rear opening of mounting unit 200, moving further into mounting unit 200 until panel guides 30 and panel spacers 32 of mounting unit 100 make contact with the underside of top panel 14 of mounting unit 200.

Figure 7:
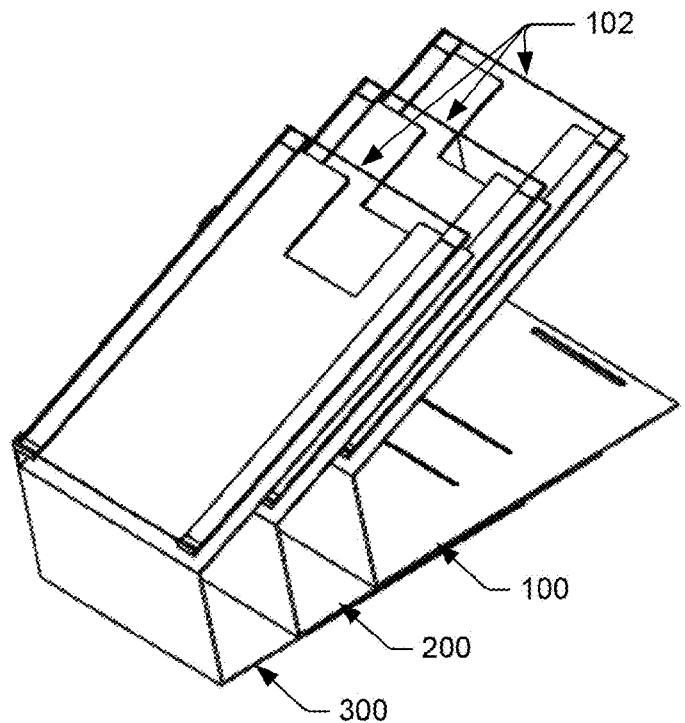
FIG. 7 is a section drawing of the stacked mounting units showing the solar panels preassembled thereon.

FIGS. 6-7 shows how a plurality of mounting units 100, 200, and 300 may be stacked or nested into each other, even when a solar panel 102 is preassembled onto the mounting unit. As noted above, the contact made by each mounting unit's panel guides 30 and panel spacers 32 create a gap between the underside of the top panel 14 of one mounting unit (e.g., mounting unit 200) and the solar panel mounted onto a nested mounting unit (e.g., mounting unit 100). This gap provides protection from each mounting unit's solar panel 102 from contact or crushing forces during storage and transit.

Figure 8:
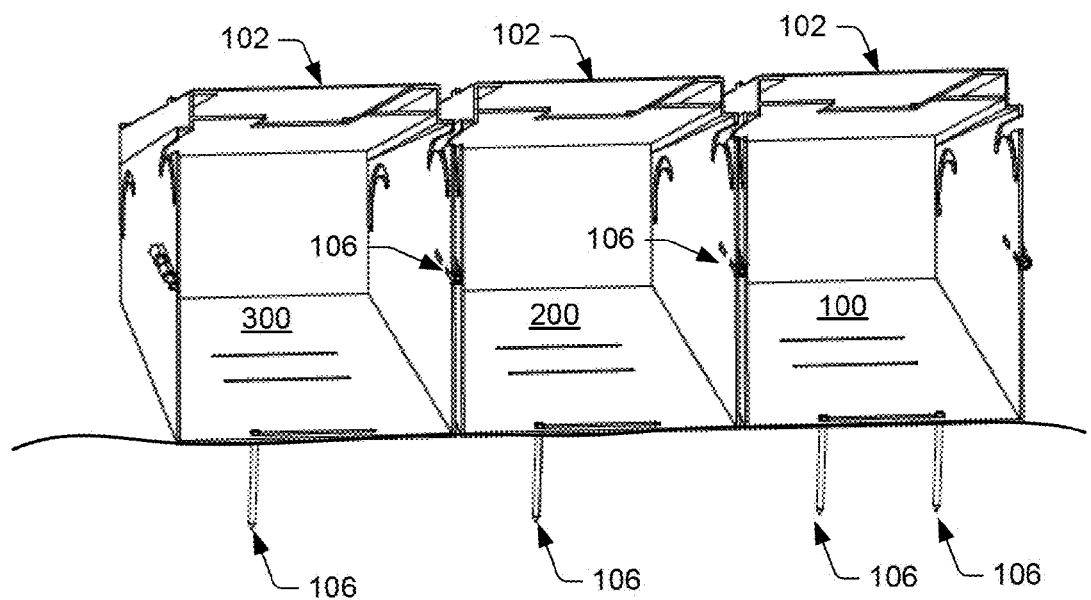
FIG. 8 shows how multiple mounting units are positioned and interlinked when deployed at the generation site.
Figure 9:
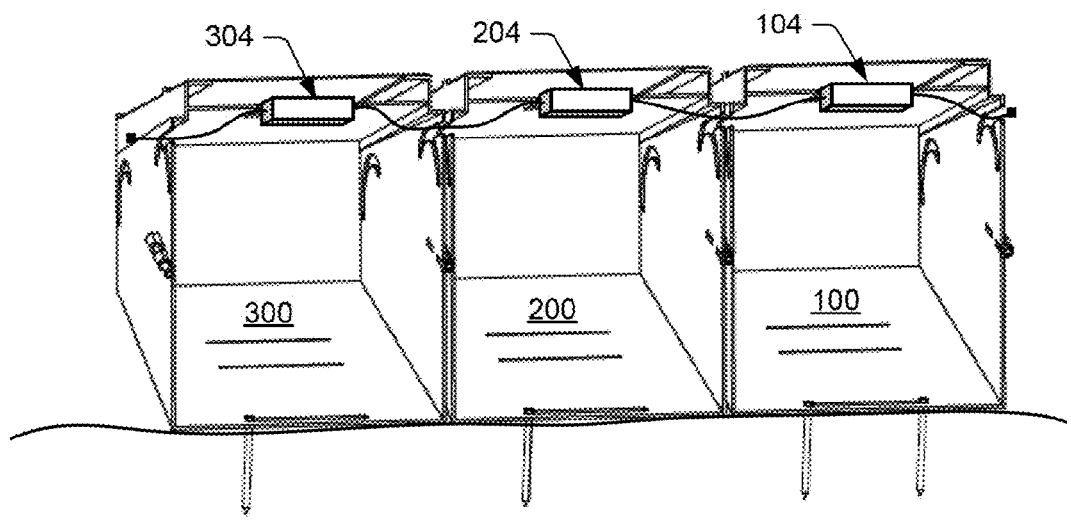
FIG. 9 shows how the power conversion devices within multiple mounting units may be electrically coupled together.
Figure 10:
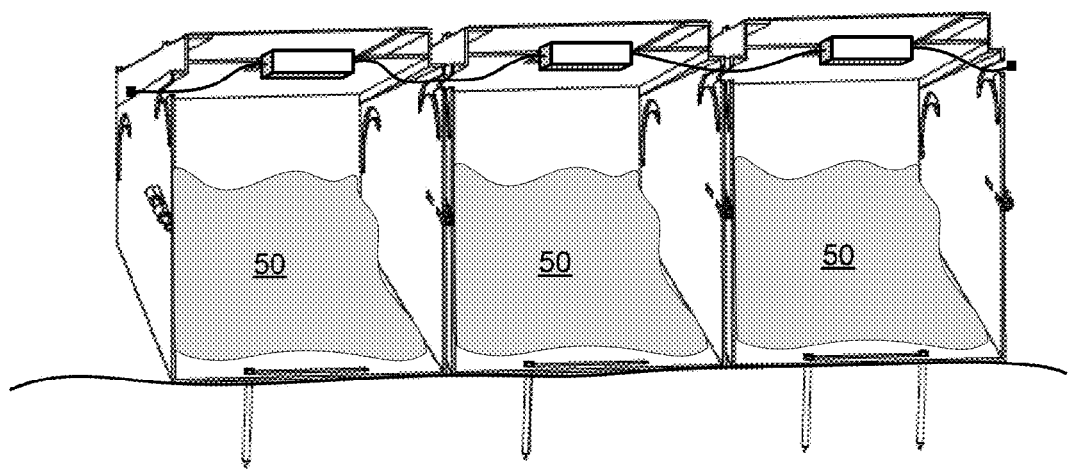
FIG. 10 shows the use of a ballast material within an interior cavity of the mounting unit in order to withstand environmental forces such as wind.

An improved method for installing a solar electricity generation system is also provided herein and shown, e.g., in FIGS. 8-10. Although described with respect to a ground mounted installation, one skilled in the art would readily understand how the system may be alternatively installed on any substantially horizontal surface, such as a building rooftop, scaffolding, frame, trailer bed, road, or a cement or concrete pad. For example, bolts or other mechanical fasteners may be inserted through the hand-stake slot 42 (instead of hinge pin-stakes 106) to secure the mounting units to the substantially horizontal surface.

Once the stacked mounting units arrive at the generation site, they may be separated by pulling the most accessible mounting unit rearward using the hand grips 22 located on the rear of each mounting unit. After the first mounting unit has been freed from its stack, the freed mounting unit can be moved by person(s) or a machine using, e.g., the hand holds 24 and 42, to the desired location.

In FIG. 8, a first mounting unit 100 is placed in the proper orientation specified for the generation site. In some embodiments, the two hinge pin-stakes 106 (FIG. 1), which may be stowed for transit within hinges 26, may be removed from the mounting unit and driven into the ground through hand-stake slot 42. The next mounting unit 200 is freed from its stack, and placed adjacent to the mounting unit 100, so that the adjacent hinges 26 are aligned. One hinge pin-stake 106 from mounting unit 200 is inserted through the hinge pin holes of the aligned hinges 26, while the second hinge pin-stake 106 is driven into the ground through hand-stake slot 42 to secure the mounting unit 200. This process is repeated for each mounting unit that is placed in the row of mounting units beginning with unit 100. In contrast to conventional systems, the process of arranging and securing mounting units 100, 200 and 300 requires no special tools (e.g., only a hammer may be needed to assist in inserting the hinge pin-stakes) and can be performed by an unskilled person or persons.

In FIG. 9, the cables of the power conversion device 104 within the first mounting unit 100 may be connected in proper polarity to the cables of the power conversion device 204 within the second mounting unit 200 by inserting a male connector of one cable into a female connector of an adjacent cable. This process may be repeated for each power conversion device that is placed in the row of power conversion devices beginning with unit 104. After the last power conversion device in the row has been connected in the serial string of devices, the connecting cable may be routed either directly to a utility power grid or into an intermediate combiner box that gathers multiple row cable inputs. From there the aggregated output may be run through a step-up transformer to match the utility power grid voltage level.

In FIG. 10, the interior cavity 20 of each mounting unit may be partially filled with a ballast material 50, which is of sufficient weight to prevent the mounting unit from dislocating or tipping due wind, snow and other environmental loads. In one embodiment, this ballast material may be native soil from the generation site. In other embodiments, this ballast material can be concrete, stones, energy storage batteries, or liquid contained within a bladder, which is secured within the mounting unit.

In some embodiments, the mounting units shipped to the generation site may comprise solar panels and/or power conversion devices already preassembled thereon. If both are included, the installation method described herein only requires the mounting units to be properly positioned on the site, mechanically and electrically coupled together, and secured to the ground or other horizontal surface (via stakes, mechanical fasteners and/or ballast material). Once electrical connections are made to the utility power grid and/or other energy storage devices, the solar electricity generation system described herein is ready to begin producing electricity. This method of installation is significantly easier, faster and cheaper than conventional installation methods, and may in some cases be performed by unskilled person(s) with the aid of a qualified electrician.

In other embodiments, the mounting units shipped to the generation site may not be preassembled with solar panels and/or power conversion devices. In such embodiments, the installation method described herein may include one or more additional steps, such as affixing one or more solar panels to the panel guides of each mounting unit. The solar panels may be affixed to the panel guides before or after the mounting units are positioned on the site, and may be affixed using any of the means discussed above. In some embodiments, the installation method may also include coupling one or more power converters to the solar panels and/or to the mounting units. The power conversion device(s) may be coupled before or after the mounting units are positioned on the site, and may comprise any of the power conversion devices discussed above. Although additional installation steps may be needed when the mounting units are not preassembled with solar panels and/or power conversion devices, the time, cost and complexity of the installation method described herein is still vastly superior to conventional methods.

Figure 11:
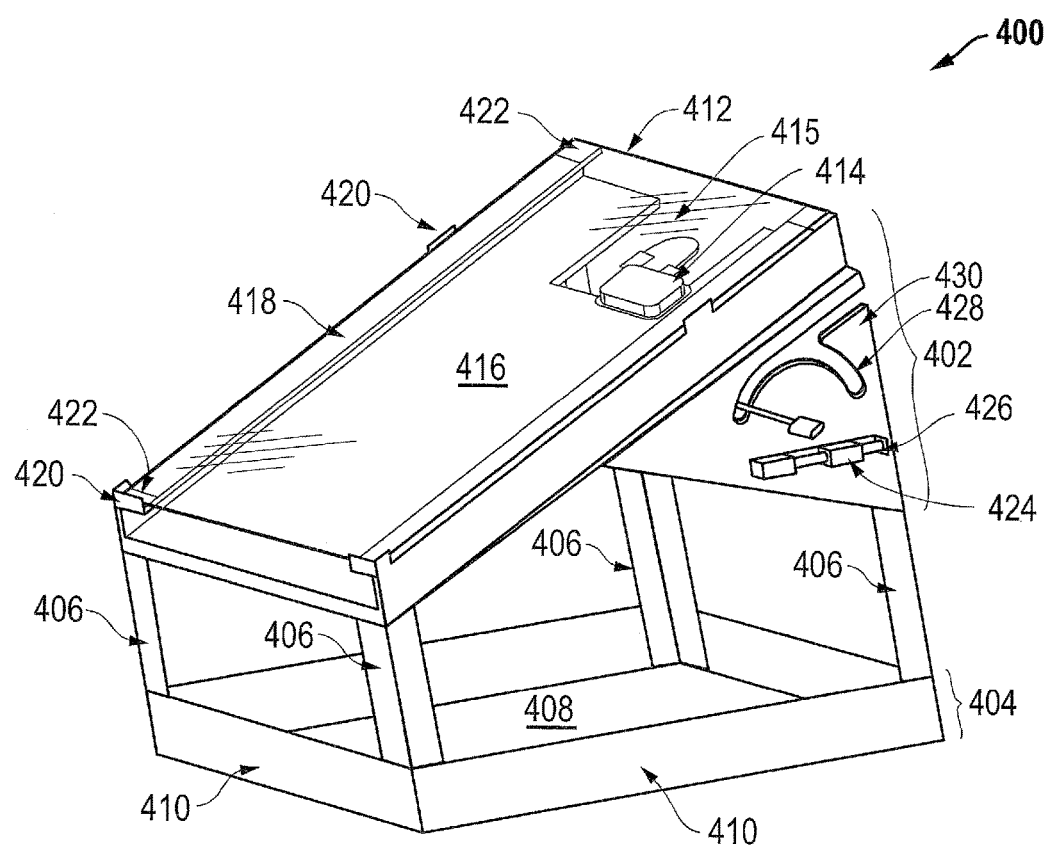
FIG. 11 shows an alternative embodiment of a solar generation system including a mounting unit configured for supporting one or more solar panels and optionally a power conversion device.

Preferred embodiments of a solar electricity generation system, methods for efficiently storing and transporting stacked mounting units, and methods for installing such mounting units at a generation site have now been described with respect to FIGS. 1-10. Although such figures illustrate various preferred embodiments of the invention, the solar electricity generation system and methods provided herein are not limited to those previously illustrated and described. As an example, an alternative embodiment of a mounting unit is illustrated in FIG. 11 and described in more detail below.

As noted above, the mounting unit 100 illustrated in FIGS. 1-10 is preferably implemented as a single molded plastic unit integrating all of the key features required to mount a solar panel and optionally a power conversion device thereto. In contrast, FIG. 11 illustrates an alternative mounting unit 400 comprising two separately molded top and bottom portions 402, 404 connected via four support legs 406. In general, support legs 406 may be used in place of the sidewalls 12 and front panel 16 described above to orient the top portion 402 (and thus the solar panel 408) at a desired angle relative to the horizontally positioned bottom portion 404. In some embodiments, at least a subset of the support legs 406 (e.g., only the back end legs, or both the front and back end legs) may comprise adjustment means (not shown) for changing the angle with which the top portion 402 is oriented relative to the bottom portion 404.

In one embodiment, the top and bottom portions 402, 404 may be formed via an injection molded process using a thermoplastic material, such as a medium or high density polyethylene (MDPE or HDPE), for example. However, other processes and/or materials may be used to produce the top and bottom portions, as long as the material used to form the portions is electrically and thermally non-conductive and resistant to environmental degradation.

In one embodiment, the support legs 406 may be formed via an extrusion or pultrusion process using a plastic material, such as MDPE, HDPE, acrylonitrile butadiene styrene (ABS), fiberglass, or fiber-reinforced plastic that may be of same or different composition than that used for the top and bottom portions 402, 404. The support legs 406 may be formed in a variety of different shapes, such as a substantially square or rectangular hollow tube, a substantially square or rectangular U-shaped channel or a substantially L-shaped member. The support legs 406 may be coupled to the top and bottom portions 402, 404 in a variety of different ways. In one embodiment, the support legs 406 may be coupled to the top and bottom portions 402, 404 via a compression and snap fit process. In addition or alternatively, the support legs 406 may be coupled to the top and bottom portions 402, 404 via an adhesive (e.g., a silicone or polyurethane adhesive), or by using mechanical fasteners (e.g., metal or plastic bolts, screws, etc.).

One advantage afforded to mounting unit 400 is that mounting unit 400 may be less costly to manufacture than mounting unit 100 due to the reduction in materials involved. In addition, mounting unit 400 avoids creating a cavity (such as cavity 20, FIG. 3) within the mounting unit, which may reduce or alleviate stresses placed on the mounting unit by high winds. In some embodiments, mounting unit 400 can be disassembled for shipping in a potentially more compact manner than mounting unit 100. As another advantage over mounting unit 100, the angle (a) with which the top portion 402 is oriented with respect to the bottom portion 404 can easily be changed by providing different heights of back end support legs 406, or by configuring two or more of the support legs 406 to be adjustable in height. The support legs could also be formed to fit irregular ground shapes or mounting surfaces beyond that supported by the hinges. Other advantages not specifically mentioned herein may also be inherently provided through the use of support legs 406.

Other than the use of support legs 406 in place of sidewalls 12 and front panel 16, the top and bottom portions 402, 404 of the mounting unit 400 may be similar to corresponding features of the previously described mounting unit 100. In FIG. 11, the bottom portion 404 of mounting unit 400 is illustrated as a substantially rectangular shaped tray or shallow bucket having a bottom panel 408 and four short sidewalls 410 extending substantially vertically from the bottom panel. The height of the sidewalls 410 may be designed to retain a ballast material (such as dirt, concrete, stones, energy storage batteries, or a liquid contained within a bladder) and to provide a mounting surface to which the support legs 406 may be attached. In one embodiment, the height of the sidewalls 410 may range between about 1-12 inches.

The top portion 402 of mounting unit 400 is generally configured for supporting one or more solar panels 412 and optionally a power conversion device 414, and comprises many of the features and components mentioned above. For instance, top portion 402 may include a top panel 416 and a pair of panel guides 418, which are formed integral with and arranged adjacent to each side of the top panel. The top panel 416 may be generally configured as described above, and thus, may include a notch 415 for mounting a power conversion device 414 within or near the top panel. In addition, the top panel 416 may include one or more slots, perforations or louvers (not shown) for improving airflow in the air channel, which is created between the top panel 416 and the solar panel(s) 412 when the solar panel(s) is assembled onto the panel guides 418.

The panel guides 418 may also be generally configured as described above, and may include solar panel spacers 420 and solar panel risers 422 for properly orienting and retaining the solar panel(s) 412 on the panel guides. As noted above, solar panel(s) 412 may be preassembled onto the panel guides 418 by adhesively bonding the lower surface of the solar panel onto the upper surface of the panel guides, in some embodiments. In such embodiments, the panel spacers 420 on panel guides 418 provide protection to the solar panel(s) 412 from contact or crushing forces when the mounting units are stacked, as described above. The panel guides 418 also provide a gap between the bottom surface of the solar panel(s) 412 and the upper surface of the top panel 416, thereby creating an air channel through which convective forces may cool the bottom surface of the solar panel(s) and improve efficiency. The gap provided by the panel guides may also allow the upper surface of the top panel 416 to be covered or coated with a reflective material, further improving efficiency.

As shown in FIG. 11, certain features found on the sidewalls 12 of the mounting unit 100 may be formed integral with the top portion 402 of the mounting unit 400. For example, hinges 424 having hinge pin-stakes 426, cable vias 428 and hand grips 430 may be included on each rearward side of the top portion 402. Hinges 424, hinge pin-stakes 426, cable vias 428 and hand grips 430 may be generally configured and may generally function as described above.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

What is claimed is:

1. A solar electric generating system comprising a mounting unit including:
   a bottom panel having a substantially planar rectangular shape;
   a top panel having a substantially planar rectangular shape, wherein the top panel is oriented at an angle with respect to the bottom panel; and
   a pair of panel guides configured to support a solar panel, wherein each panel guide is formed integral with and adjacent to an opposing side of the top panel, wherein a length of each panel guide is approximately equal to a length of the top panel, and wherein each panel guide comprises:
   a horizontal portion configured to support a bottom surface of the solar panel upon an upper surface of the horizontal portion;
   a vertical portion configured to elevate the bottom surface of the solar panel above an upper surface of the top panel to provide an air channel for cooling the bottom surface of the solar panel; and
   one or more solar panel spacers extending upward from one or more peripheral edges of the horizontal portion of the panel guide, wherein the one or more solar panel spacers are configured to retain the solar panel in position during assembly, and to protect the solar panel from contact when multiple mounting units are stacked.

2. The solar electric generation system as recited in claim 1, wherein a height of the vertical portions of the panel guides is between about 1 inch and about 12 inches.

3. The solar electric generation system as recited in claim 1, wherein a width of the horizontal portions of the panel guides is between about ¼ inch and about 4 inches.

4. The solar electric generation system as recited in claim 1, further comprising the solar panel, wherein the bottom surface of the solar panel is affixed to the upper surfaces of the horizontal portions of the panel guides.

5. The solar electric generation system as recited in claim 4, wherein the bottom surface of the solar panel is affixed to the upper surfaces of the horizontal portions of the panel guides with an adhesive, a plurality of clamps, or a plurality of clips.

6. The solar electric generation system as recited in claim 1, wherein a length of each panel guide is approximately equal to a length of the solar panel.

7. The solar electric generation system as recited in claim 1, wherein each panel guide further comprises one or more solar panel risers on the upper surface of the horizontal portion of the panel guide, wherein the one or more solar panel risers are configured to provide clearance between the horizontal portion of the panel guide and the bottom surface of the solar panel for a desired thickness of adhesive be applied between the horizontal portion of panel guide and the bottom surface of the solar panel.

8. The solar electric generation system as recited in claim 1, further comprising a power conversion device configured for electrically coupling to the solar panel to convert a DC signal output from the solar panel into an AC signal.

9. The solar electric generation system as recited in claim 8, wherein the power conversion device is mechanically coupled to the mounting unit.

10. The solar electric generation system as recited in claim 8, wherein the power conversion device is mounted within or near a notch formed within the mounting unit.

11. The solar electric generation system as recited in claim 1, wherein an upper surface of the top panel comprises a reflective material.

12. The solar electric generation system as recited in claim 1, wherein the mounting unit further comprises a pair of sidewalls extending substantially vertically from opposing edges of the bottom panel to abut opposing edges of the top panel, wherein the bottom panel, the top panel and the sidewalls of the mounting unit are formed integrally as one piece.

13. The solar electric generation system as recited in claim 12, wherein the mounting unit further comprises a front panel formed integral with the bottom panel, the sidewalls and the top panel.

14. The solar electric generation system as recited in claim 12, wherein the mounting unit further comprises a pair of hinges, each located on one of the sidewalls near a rear of the mounting unit and configured to connect adjacent mounting units together.

15. The solar electric generation system as recited in claim 1, wherein the mounting unit further comprises a plurality of support legs configured for connecting the top panel to the bottom panel and for orienting the top panel at the angle relative to the bottom panel.

16. The solar electric generation system as recited in claim 15, wherein at least a subset of the support legs comprises adjustment means for changing the angle with which the top panel is oriented relative to the bottom panel.

17. The solar electric generation system as recited in claim 1, wherein the mounting unit is formed entirely or almost completely from electrically inert materials, thus, avoiding the need to electrically ground the mounting unit.

18. The solar electric generation system as recited in claim 17, wherein the electrically inert materials are selected from a group consisting of a plastic material, a plastic material impregnated with a fiber material, a metal material over-molded with a plastic layer, or a fiberglass material.

19. A solar electric generating system comprising a mounting unit including:
  a bottom panel having a substantially planar rectangular shape;
  a top panel having a substantially planar rectangular shape, wherein the top panel is oriented at an angle with respect to the bottom panel; and
  a pair of panel guides configured to support a solar panel, wherein each panel guide is formed integral with and adjacent to an opposing side of the top panel, wherein a length of each panel guide is approximately equal to a length of the top panel, and wherein each panel guide comprises:
    a horizontal portion configured to support a bottom surface of the solar panel upon an upper surface of the horizontal portion;
    a vertical portion configured to elevate the bottom surface of the solar panel above an upper surface of the top panel to provide an air channel for cooling the bottom surface of the solar panel; and
    one or more solar panel risers on the upper surface of the horizontal portion of the panel guide, wherein the one or more solar panel risers are configured to provide clearance between the horizontal portion of the panel guide and a bottom surface of the solar panel for a desired thickness of adhesive to be applied between the horizontal portion of panel guide and the bottom surface of the solar panel.

20. The solar electric generation system as recited in claim 19, wherein a length of each panel guide is approximately equal to a length of the solar panel.

21. The solar electric generation system as recited in claim 19, wherein the mounting unit further comprises a pair of sidewalls extending substantially vertically from opposing edges of the bottom panel to abut opposing edges of the top panel, wherein the bottom panel, the top panel and the sidewalls of the mounting unit are formed integrally as one piece.

22. The solar electric generation system as recited in claim 21, wherein the mounting unit further comprises a front panel formed integral with the bottom panel, the sidewalls and the top panel.

23. The solar electric generation system as recited in claim 19, wherein the mounting unit is formed entirely or almost completely from electrically inert materials selected from a group consisting of a plastic material, a plastic material impregnated with a fiber material, a metal material over-molded with a plastic layer, or a fiberglass material.

24. The solar electric generation system as recited in claim 19, wherein an upper surface of the top panel comprises a reflective material.

25. The solar electric generation system as recited in claim 19, further comprising a power conversion device mechanically coupled to the mounting unit, wherein the power conversion device is configured to electrically couple to the solar panel to convert a DC signal output from the solar panel into an AC signal.

26. The solar electric generation system as recited in claim 25, wherein the power conversion device is mounted within or near a notch formed within the mounting unit.

27. The solar electric generation system as recited in claim 19, further comprising the solar panel, wherein the solar panel is affixed to the upper surfaces of the horizontal portions of the panel guides.

28. The solar electric generation system as recited in claim 27, wherein the solar panel is affixed to the upper surfaces of the horizontal portions of the panel guides with an adhesive, a plurality of clamps, or a plurality of clips.

* * * * *